United States Patent [19]

Hattori

[11] Patent Number: 5,367,478
[45] Date of Patent: Nov. 22, 1994

[54] MUTUAL DIVISION CIRCUIT

[75] Inventor: Masayuki Hattori, Tokyo, Japan

[73] Assignee: Sony Corporation, Tokyo, Japan

[21] Appl. No.: 939,593

[22] Filed: Sep. 2, 1992

[30] Foreign Application Priority Data

Sep. 6, 1991 [JP] Japan ................... 3-254183

[51] Int. Cl.$^5$ ............................ G06F 7/00
[52] U.S. Cl. ..................... 364/746.1; 364/761
[58] Field of Search .............. 364/746.1, 761

[56] References Cited

U.S. PATENT DOCUMENTS

| | | | |
|---|---|---|---|
| 4,567,568 | 1/1986 | Inagawa et al. | 364/746.1 X |
| 4,574,361 | 3/1986 | Inagawa et al. | 364/746.1 |
| 4,800,515 | 1/1989 | Hori et al. | 364/746.1 |
| 4,975,867 | 12/1990 | Weng | 364/746.1 |

*Primary Examiner*—Tan V. Mai
*Attorney, Agent, or Firm*—Jay H. Maioli

[57] ABSTRACT

A mutual division circuit which can reduce a circuit scale thereof considerably and which can also be operated at high speed to thereby increase a throughput considerably. A switching instruction which selects either a normal connection or cross connection is generated on the basis of an initial value previously set by a connection switching judging block (3) and a value stored in a register of a block ((A) 1). In parallel to this operation, divided results and a value output from the preceding stage are stored in respective blocks ((B) 2) and one of a normal connection calculation and a cross connection calculation is carried out in response to the switching instruction. Further, a value output from the final stage of the blocks ((B) 2) is stored in the block ((A) 1), and one of the normal connection calculation and the cross connection calculation is performed in response to the switching instruction. Then, the calculated result is supplied to the respective blocks ((B) 2) to effect an Euclidean mutual division calculation.

5 Claims, 10 Drawing Sheets

FIG. 3 (PRIOR ART) [Step3] [Coefficient of Three-order of $R_0(X)$ is $a^8 \neq 0$; $d(R_0) < d(Q_0)$ ∴ Crossed]

FIG. 4 (PRIOR ART) [Step2] [$d[R_1] \not< d[Q_1]$ ∴ Not Crossed]

FIG. 5 (PRIOR ART) [Step3] $\begin{bmatrix} d(R_2) < d(Q_2) \\ \text{Coefficient of Two-order} \\ \text{of } R_2(X) \text{ is } a_5 \neq 0 \\ \therefore \text{Crossed} \end{bmatrix}$ FIG. 6 (PRIOR ART) [Step4] $\begin{bmatrix} d(R_3) \not< d(Q_3) \\ \therefore \text{Not Crossed} \end{bmatrix}$

FIG. 13

MUTUAL DIVISION CIRCUIT

BACKGROUND OF THE INVENTION

1. Field of the Invention

The present invention relates to mutual division circuits and, more particularly, is directed to an Euclidean division circuit for carrying out Euclidean mutual division.

2. Description of the Prior Art

When an error correction system is realized by using an error correction code represented by a Bose-Chaundhuri-Hocquenghem (BCH) code and a Reed-Solomon code, a means for obtaining an error locator polynomial from a syndrome generated by a reception signal plays the most important role.

As a method for realizing this process, a method using an Euclidean mutual division algorithm is widely known.

The Euclidean mutual division method is generally known as an algorithm through which the most common divisor of two polynomials is obtained. In the error correction code, the error locator polynomial can be calculated from a syndrome by the skillful application of a calculation procedure that is used in the process of the Euclidean mutual division method.

The calculation process of the Euclidean mutual division method has the advantage such that it can be composed of a systolic-array architecture wherein it can be realized by cascading a plurality of relatively simple calculation units (hereinafter referred to as "mutual division unit").

An example that can realize an algorithm of Euclidean mutual division method by means of the systolic array has been proposed by Howard M. Shao et. al. (see Howard M. Shao et. al. "A VLSI Design of a Pipeline Reed-Solomon Decoder" IEEE Trans. on Computers Vol.C-34 May, 1985). This method will hereinafter be referred to as a "method A". The method A has defects such that its algorithm is not perfect and that each unit needs two multipliers for a finite field. Thus, when a system that needs a high speed real processing is constructed based on this method A, its circuit scale is increased As improved methods of the above method A, we have previously proposed a method (see U.S. patent application Ser. No. 07/623,235), issued on Feb. 9, 1993 as U.S. Pat. No. 5,185,711. This previously-proposed method will be referred to as a "method B" in the description which follows. This method B employs an improved algorithm of the preceding algorithm disclosed in the aforementioned method A and replaces two finite field multipliers in the mutual division unit with a multiplier for a finite field and a divider for a finite field. Further, the method B replaces the finite field dividers used in a plurality of cascaded mutual division units with a divider for a finite field. Hence, a circuit scale can be reduced.

However, the method B needs a complex control circuit that is needed to commonly use the divider for a finite field from a plurality of mutual division units so that an operation speed cannot be increased. Further, although the divider for a finite field is used commonly, each mutual division unit needs a circuit for judging operation from the degree of polynomial and a control circuit so that the circuit scale is increased a little.

The method B will be described below in detail.

An error correction technique will be described first.

This system is effective not only for error correction but also all systems which are needed in order to realize the Euclidean mutual division method at high speed. This method when applied to the error correction method using Reed-Solomon code will be described.

In the description which follows, exponents are depicted by underlined letters following " " and suffixes are depicted by underlined letters having no " ".

Let us consider an error correction system having a code length of n which can correct an error of t symbols by using a finite field of GF (2 m). Let it be assumed that a j expresses that an error locator is j'th position where the head of code is selected to be 0th position. Then, if the code has m errors in total, then total errors of the code will be described by error locator Xi (i=1, ..., m) and error pattern yi (i=1, ..., m). That is, if there are m (m≦2t) errors in total, then m sets of (Xi, Yi) are required.

A polynomial known as an error locator polynomial $\sigma(X)$ is defined by using this error locator Xi (i=1, ..., m). The error locator polynomial $\sigma(X)$ becomes 0 if error locator X=Xi  −1 where i=1, ..., m.

$$\sigma(X) = \sum_{k=1}^{m} (1 - XX_k) \tag{1}$$

Coefficient of $\sigma(X)$ is expressed as:

$$\sigma(X) = 1 + \sigma_1 X + \sigma_2 X^2 + \ldots \sigma_a X^a \tag{2}$$

Further, using the error locator polynomial $\sigma(X)$ and a syndrome polynomial S(X), an error evaluator polynomial $\omega(X)$ is defined as:

$$\omega(X) = S(X)\sigma(X)(\bmod X^{2t}) \tag{3}$$

The error correction process will next be described in the order of steps.

STEP 1

2t syndromes S, expressed by the following equation (4)

$$S = [S_1 \cdot S_2, \ldots, S_{2t}]^T \tag{4}$$

are obtained as a product of a reception signal r and a parity check matrix H. That is, the syndrome S is expressed as:

$$S = Hr \tag{5}$$

Then, let us define a polynomial called a syndrome polynomial S(X) that has the syndrome S thus obtained as coefficient of a polynomial.

$$S(X) = \sum_{j=1}^{2t} S_j X^{j-1} = \sum_{j=1}^{2t} \sum_{i=1}^{m} Y_i X_i^j X^{j-1} \tag{6}$$

STEP 2

The error locator polynomial $\sigma(X)$ is obtained from the syndrome polynomial S(X), where the algorithm based on the Euclidean mutual division method is employed.

STEP 3

The error location $X = X_i^{-1}$ (where $i = 1, \ldots, m$) is searched. It is to be understood that substituting all elements $X = \alpha^0 \ldots \alpha^{n-1}$ included in $GF(2^m)$ into $\sigma(X)$ by using the coefficient of the error locator polynomial $\sigma(X)$, the position at which $\sigma(X) = 0$ is satisfied is the error locator $X_i$ (where $i = 1, \ldots, m$).

STEP 4

If the error locator $X_i$ (where $i = 1, \ldots, m$) is given, then an error pattern $Y_i$ (where $i = 1, \ldots, m$) is calculated by using the error evaluator polynomial $\omega(X)$ as:

$$Y_i = \frac{\omega(X_i^{-1})}{\sigma'(X_i^{-1})} \tag{7}$$

STEP 5

The received signal is error-corrected by using the error locator $X_i$ (where $i = 1, \ldots, m$) and error pattern $Y_i$ (where $i = 1, \ldots, m$) thus obtained.

As described above, the error correction is carried out through the processes of steps 1 to 5. The details thereof were already described in the aforesaid U.S. Patent Application.

A method of deriving an error locator polynomial will be described below. This deriving method or process is equivalent to the STEP 2 of the above error correction process. A method of deriving the error locator polynomial $\sigma(X)$ by using the Euclidean mutual division algorithm is known as follows:

A method of deriving an error location polynomial:

If $r-1(X) = X^{2t}$ and $r0(X) = S(X)$, then $\deg(r0(X)) < \deg(r-1(X))$ because the degree of $S(X)$ is the degree of $2t-1$.

Then, the division having a polynomial $q_i(X)$ as a quotient is repeated made by using $r-1(X)$ and $r0(X)$. This division is the same calculation as the Euclidean mutual division which is given as follows:

Initially, the following calculations are made sequentially as:

$r_{-1}(X) = q_1(X)r_0(X) + r_1(X), \deg(r_1(X)) < \deg(r_0(X))$ $r_0(X) = q_2(X)r_1(X) + r_2(X), \deg(r_2(X)) < \deg(r_1(X))$ $r_{j-2}(X) = q_j(X)r_{j-1}(X) + r_j(X),$
$\deg(r_j(X)) < \deg(r_{j-1}(X)) \tag{8}$ The calculation is brought to an end if the following condition is satisfied:

$\deg(r_j(X)) < t-1 \tag{9}$

At that time, when equations $r1(X), r2(X) \ldots rj-1(X)$ are sequentially substituted with equations below, $rj(X)$ can be given by using $r-1(X) = X^{2t}$, $r0(X) = S(X)$ which are defined first:

$r_j(X) = S(X)A(X) = X^{2t}B(X) \tag{10}$

The thus obtained $rj(X)$ and $A(X)$ become $\omega(X)$ and $\sigma(X)$, respectively.

In order to realize this procedure with a hardware, how to obtain $qj(X)$ and $rj(x)$ by successively executing the division and how to realize a procedure in which the inverse substitution is executed to calculate $\sigma(X)$ from $r1(X), r2(X), \ldots, rj-1(X)$ thus obtained become problems to be solved.

In the process of the Euclidean mutual division method, it is known that, as a result of division, an order of remainder is lowered more than two orders per division. The hardware architecture that realizes the Euclidean mutual division must operate without failure in such case.

In fact, a series of such procedures can be realized by using the following systematic algorithm if the above-mentioned algorithm is rewritten such that the order of the ordinary Euclidean mutual division algorithm is decremented by each order. This algorithm is an improvement of the preceding algorithm by the assignee of the present application. A summary of this algorithm will be described below. In this case, this algorithm will be referred to as "improved Euclidean mutual division algorithm (2)" in the description which follows.

"Improved Euclidean mutual division method (2)"

Initial conditions for this improved algorithm are given as follows:

$R_0(X) = S(X), Q_0(X) = X^{2t}$ $\lambda_0(X) = 1, \mu_0(X) = 0$ $dR_0 = 2t-1, dQ_0 = 2t \tag{11}$ These conditions are repeated.

In i'th step, $l_{i-1}(X) = dR_{i-1} - dQ_{i-1}$

Set coefficient of $(dR_{i-1})$ order of $R_{i-1}(X)$ to $a_{i-1}$

Set coefficient of $(dQ_{i-1})$ order of $Q_{i-1}(X)$ to $b_{i-1} \tag{12}$

In the case of $l_{i-1} > 0$ (normal mode), the following equation can be given:

$R_i(X) = R_{i-1}(X) + (a_{i-1}/b_{i-1})Q_{i-1}(X)X^{l_{i-1}}$ $\lambda_i(X) = \lambda_{i-1}(X) + (a_{i-1}/b_{i-1})\mu_{i-1}(X)X^{l_{i-1}}$ $Q_i(X) = Q_{i-1}(X)$ $\mu_i(X) = \mu_{i-1}(X)$ $dR_i = dR_{i-1} - 1$ $dQ_i = dQ_{i-1} \tag{13}$ In the case of $l_{i-1} < 0$ and $a_{i-1} \neq 0$ (cross mode), the following equation can be given:

$R_i(X) = Q_{i-1}(X) + (a_{i-1}/b_{i-1})R_{i-1}(X)X^{-l_{i-1}}$ $\lambda_i(X) = \lambda_{i-1}(X) + (a_{i-1}/b_{i-1})\mu_{i-1}(X)X^{-l_{i-1}}$ $Q_i(X) = R_{i-1}(X)$ $\mu_i(X) = \lambda_{i-1}(X)$ $dR_i = dQ_{i-1} - 1$ $dQ_i = dR_{i-1} \tag{14}$ In the case of $li-1<0$ and $ai-1=0$ (shift mode), the following equation can be given:

$$R_i(X) = R_{i-1}(X)$$

$$\lambda_i(X) = \lambda_{i-1}(X)$$

$$Q_i(X) = Q_{i-1}(X)$$

$$\mu_i(X) = \mu_{i-1}(X)$$

$$dR_i = dR_{i-1} - 1$$

$$dQ_i = dQ_{i-1} \quad (15)$$

Stop Condition

If this process is repeated 2t times, then the process is brought to an end.

$$i = 2t \quad (16)$$

This yields:

$$\sigma(X) = \lambda_{2t}(X)$$

$$\omega(X) = R_{2t}(X) \quad (17)$$

When the calculation step is executed 2t times without fail as the stop condition, dR2t that is finally obtained indicates a degree of C(X).

It is needless to say that the order of $\sigma(X)$ is $dR2t+1$. In accordance with this algorithm, $\sigma(X)$ and $\omega(X)$ can be obtained after the calculation was executed 2t times.

As disclosed in U.S. patent application Ser. No. 07/623,235, dR2t expresses finally the order of R2t(X), i.e., $\omega(X)$. If the calculation is executed in the normal mode and in the cross mode, then dRi and dQi during the calculation process express the orders of Ri(X) and Qi(X). However, it is to be noted that in the shift mode where the highest-order coefficient of Ri(X) becomes 0, dRi and dQi do not express the orders of Ri(X) and Qi(X). The reason for this is that, even when the order of the remainder in one division is lowered more than two orders in the Euclidean mutual division process, dRi is decremented by one according to the algorithm described in U.S. patent application Ser. No. 07/623,325. For further details, U.S. patent application Ser. No. 07/623,325 will be referred to.

A method of realizing the conventional Euclidean mutual division algorithm in the form of a hardware will be described below.

The aforesaid prior art on "Howard M. Shao et. al." A VLSI Design of a Pipeline Reed-Solomon Decoder" IEEE Trans. on Computers Vol.C-34 May 1985 describes an example in which the Euclidean mutual division algorithm is realized in the form of a hardware by using a systolic-array architecture (method of this example will be referred to as a method A).

This hardware, however, does not correspond to the case such that the order of the remainder during the division carried out in the Euclidean mutual division method is lowered more than two degrees one at a time and cannot realize the Euclidean mutual division algorithm completely.

Moreover, the above method A needs two multipliers for a finite field in each unit so that a circuit scale is increased when constructing a system which requires a high speed real time processing.

As mentioned before, we have proposed the method B as the improved method therefor.

According to the method B, the two multipliers for a finite field in the mutual division unit shown in the method A are replaced with one multiplier for a finite field and one divider for a finite field. Also, one divider for a finite field is used commonly for the dividers for a finite field in a plurality of cascaded mutual division units, thereby reducing the circuit scale.

Figure 1:
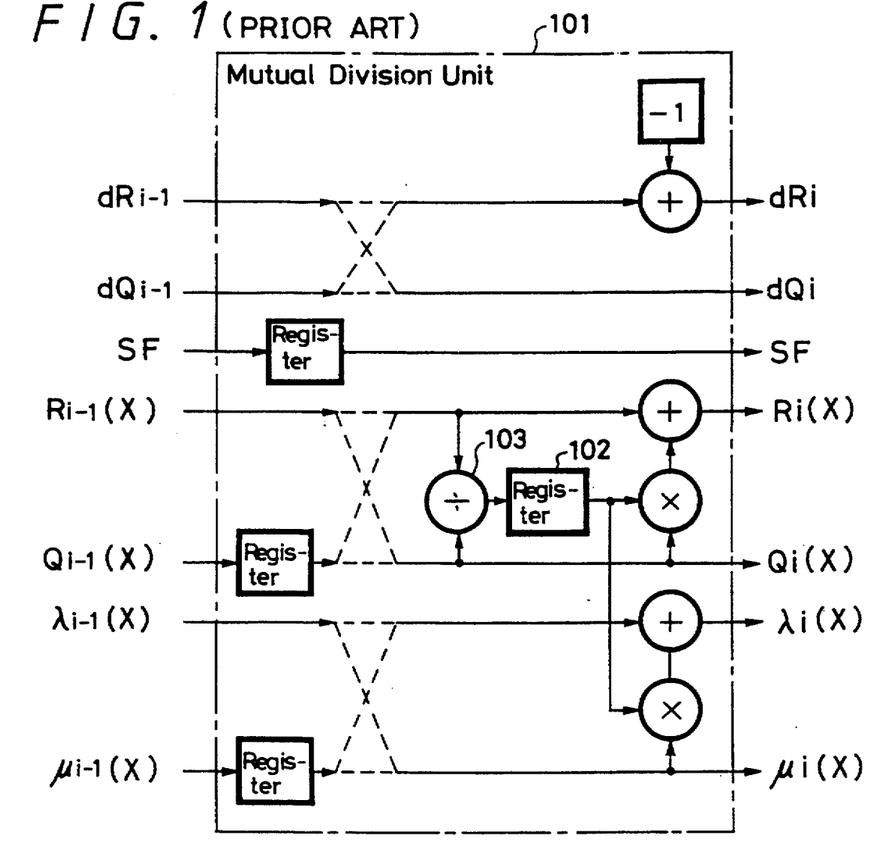
FIG. 1 is a block diagram showing an example of a mutual division unit utilized in a conventional Euclidean mutual division circuit.

The method B utilizes a fundamental calculation unit (referred to as "mutual division unit" in the description which follows) 101 shown in FIG. 1 of the accompanying drawings. The mutual division unit 101 executes the step 1 of the above-mentioned improved Euclidean mutual division method (2). As shown in FIG. 1, four polynomials $Ri-1(X)$, $Qi-1(X)$, $\lambda i-1(X)$ and $\mu i-1(X)$, which are inputs of the Euclidean mutual division method in respective steps, are sequentially input in the order of coefficient data of $dQi-1$ order. In FIG. 1, reference letter SF denotes a start flag signal that indicates the first coefficient data. At the same time, $dRi-1$ and $dQi-1$ are input to the mutual division unit 101.

Dashed line portions in the mutual division unit 101 denote data path switching selectors which select data such that data are crossed in the cross-mode calculation. In other cases, data are not crossed but selected. That is, when the coefficient data of $dRi-1$ order is input (i.e., when the start flag signal SF is input), it is determined whether or not the coefficient data $ai-1$ of $dRi-1$ order in $Ri-1(X)$ is 0. Data are crossed only in the case that $li-1 \neq 0$ and $dRi-1 < dQi-1$.

Consequently, when data are crossed, $ai-1/bi-1$ are held in a register 102, while in other cases $bi-1/ai-1$ are held in the register 102. Thus, all coefficient data of the polynomials are calculated. As a result, each time the input data is passed through this mutual division unit 101 once, one step of the improved Euclidean mutual division method (2) is calculated.

Figure 2:
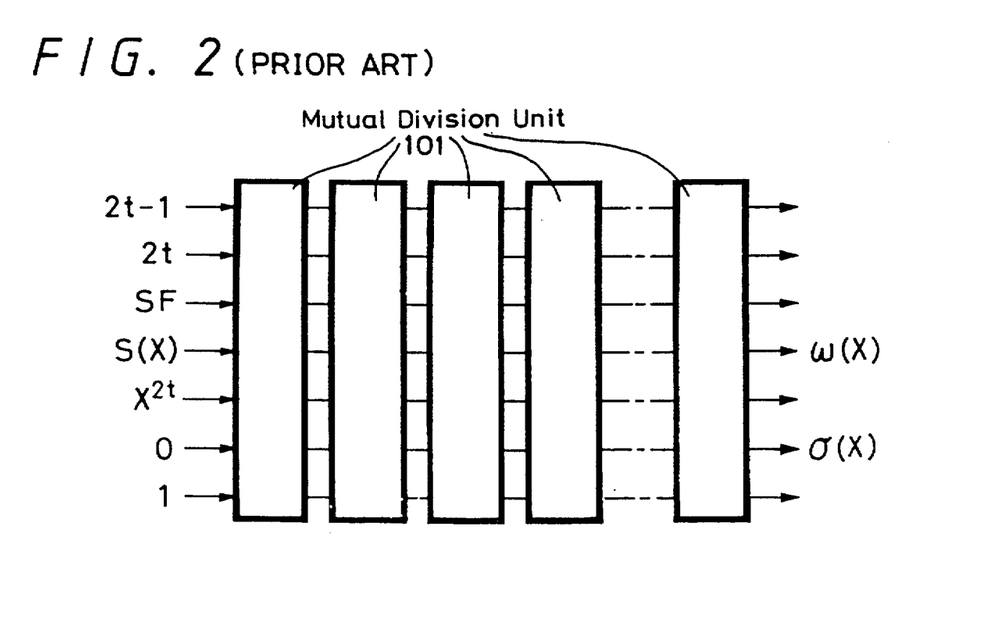
FIG. 2 is a block diagram showing an example of a conventional Euclidean mutual division circuit.

Accordingly, if 2t mutual division units 101 are connected in cascade as shown in FIG. 2 and the following data expressed as $$R_0(X) = S(X), Q_0(X) = X^{2t}$$

$$\lambda_0(X) = 1, \mu_0(X) = 0$$

$$dR_0 = 2t-1, dQ_0 = 2t \quad (18)$$

are input as data, then the 2t'th mutual division unit 101 derives $\sigma(X)$ and $\omega(X)$ as its outputs.

Figure 3:
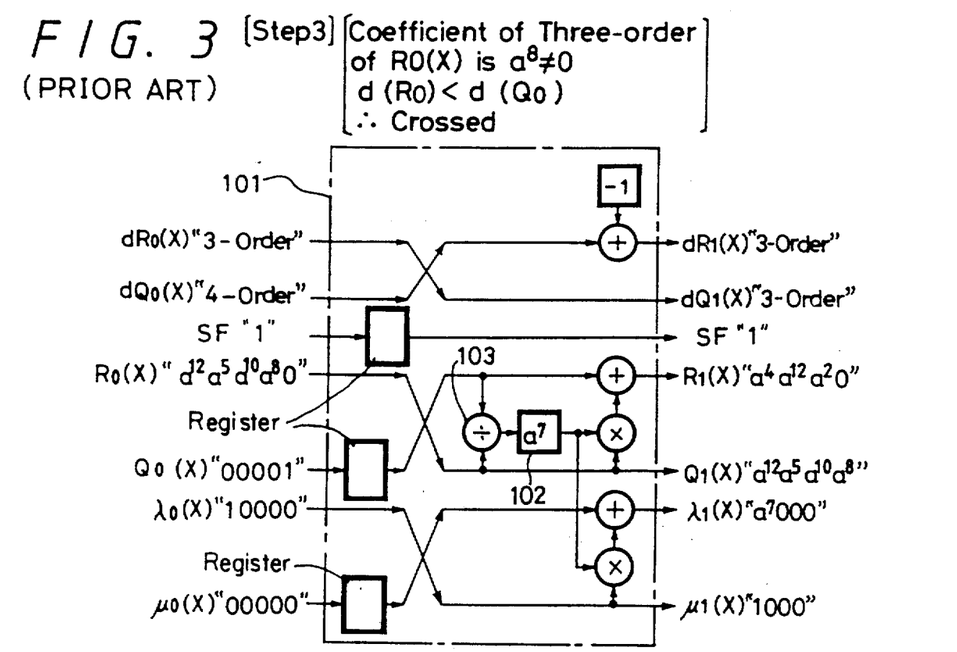
FIGS. 3 through 6 are respectively diagrams showing an example in which the conventional Euclidean mutual division circuit shown in FIG. 2 is operated.
Figure 4:
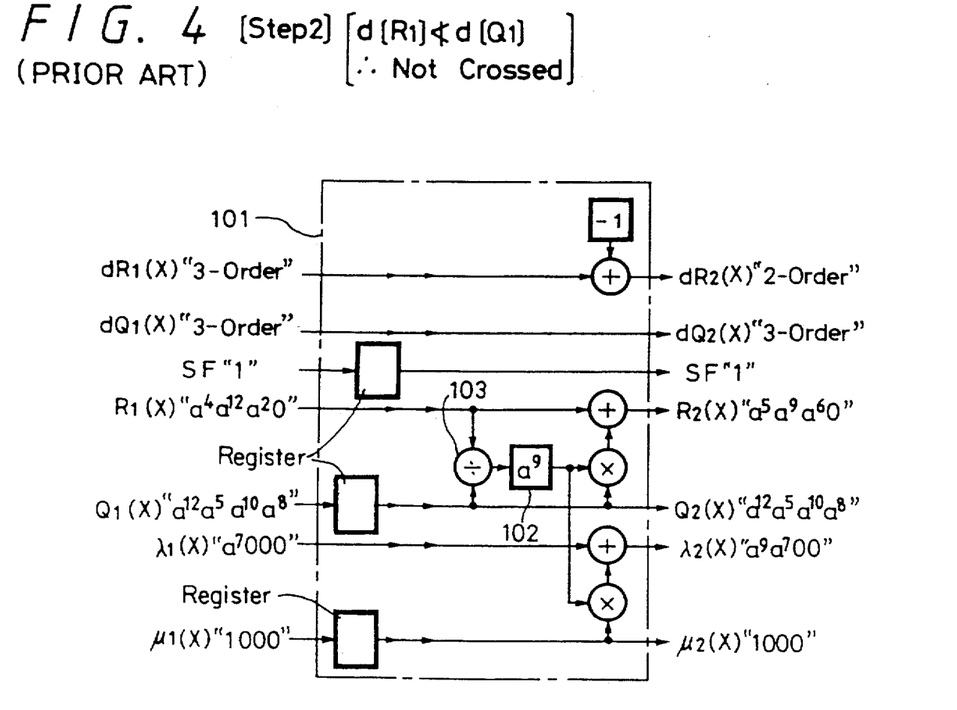
Figure 5:
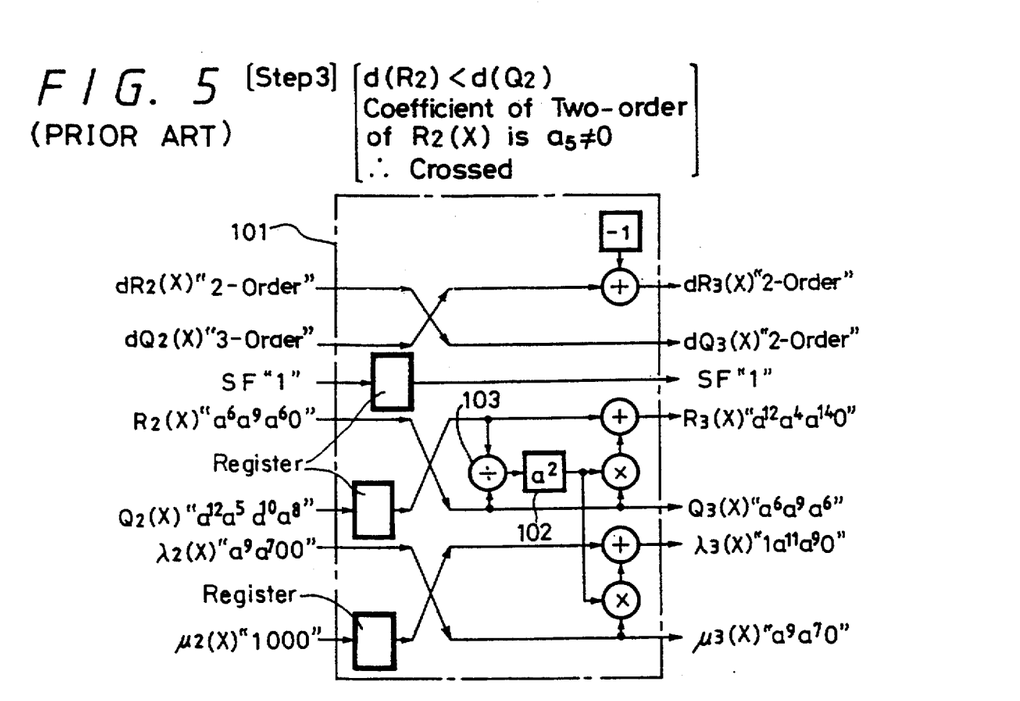
Figure 6:
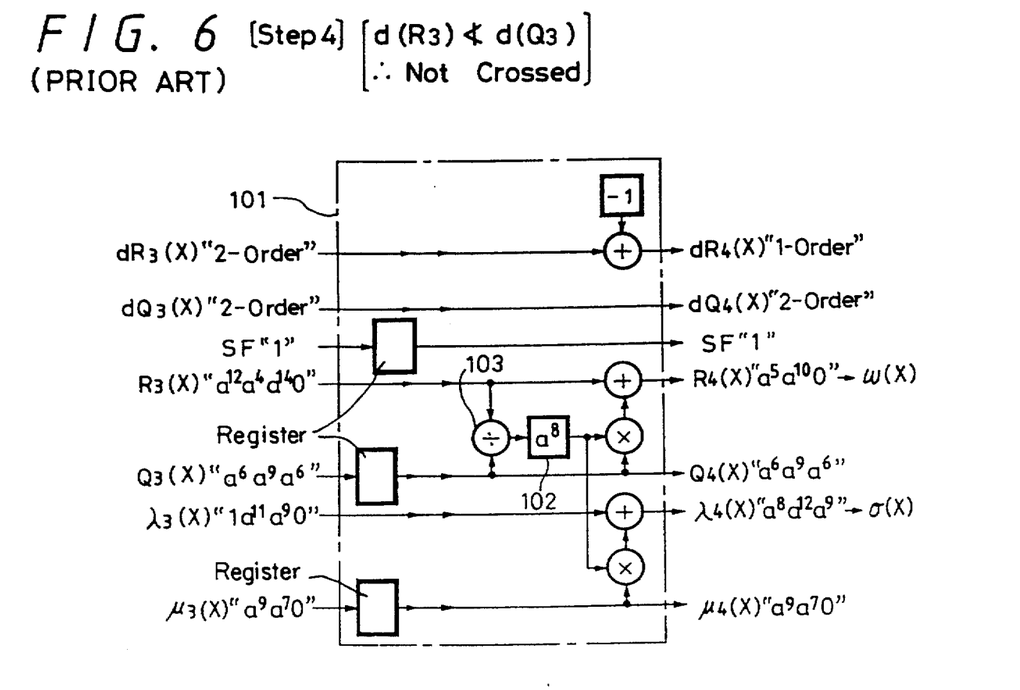

An example of operation of U.S. patent application Ser. No. 07/623,235 will be described with reference to FIGS. 3 to 6. In this example, data are calculated in the cross-mode in FIGS. 3 and 5, whereas data are calculated in the normal mode in FIGS. 4 and 6. It is apparent that, as shown in FIG. 6, when input data is passed through the mutual division unit 101 four times, the mutual division unit 101 at the final stage derives $\sigma(X)$ and $\omega(X)$.

As is evident from the above-mentioned algorithm, two polynomials $\sigma(X)$ and $\omega(X)$ are apparently shifted to the higher-order and then output after the calculation of 2t steps is carried out as if they are polynomials of 2t-order when the number of errors occurred in actual practice is less than t. Accordingly, orders may be matched with reference to the value of dR2t or the stop condition may be varied as $dRi < t$ in the improved Euclidean mutual method (2).

FIGS. 3 through 6 are diagrams used to explain only the theory of the Euclidean mutual division method where delay times of elements or the like are not taken into consideration. For further details of the implementation of FIGS. 3 to 6, the improved Euclidean mutual division method previously-proposed by the assignee of the present application will be referred to.

Figure 7:
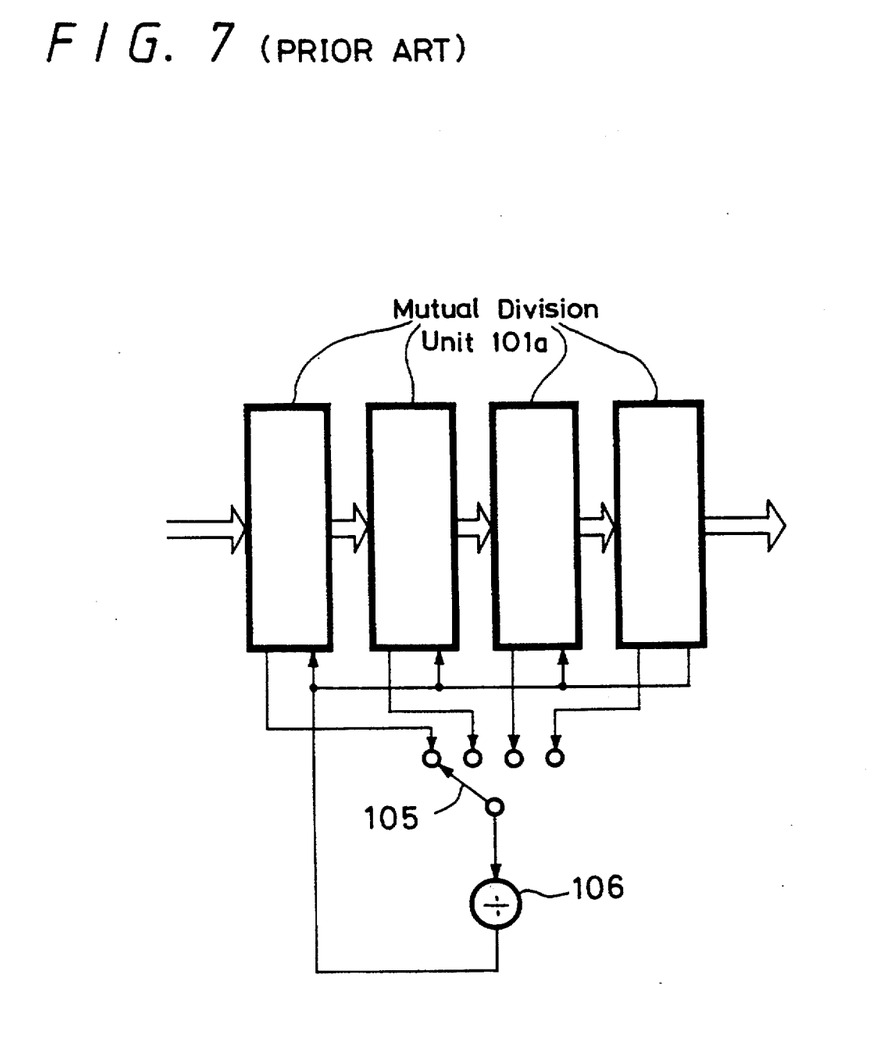
FIG. 7 is a block diagram showing another example of the conventional Euclidean mutual division circuit.

Further, according to the method B, since the dividers 103 for a finite field in the respective mutual division units 101 need not be operated simultaneously, mutual division units 101a in which the dividers 103 for a finite field are removed from the above mutual division units 101 are connected in cascade. Then, $Ri-1(X)$ and $Qi-1(x)$ are generated from each mutual division unit 101a and then sequentially selected by a selector switch 105, divided by a divider 106 for a finite field and then returned to the corresponding mutual division unit 101a. Thus, the mutual division units 101a share the common divider 106 for a finite field in a time division manner, thereby realizing the reduction of the overall circuit scale.

On the other hand, a control circuit that is required because a plurality of mutual division units 101a share the common divider 106 for a finite field becomes complicated and the operation speed thereof cannot be improved.

Further, since each mutual division unit 101a a needs the circuit which determines operation by detecting whether or not the order of the polynomial and the coefficient data of the $Ri-1(X)$ and $dRi-1$ order are 0 and the control circuit such as the data switching selector or the like even though the divider 106 for a finite field is commonly shared, the circuit scale is increased a little.

In addition, if this method B is used, then the syndromes $S2t, S2t-1, \ldots, S1$ which are the coefficient data of the syndrome polynomial $S(X)$ must be input in the order of high-order coefficient data. However, since the syndromes $S2t, S2t-1, \ldots, S1$ are calculated simultaneously, it becomes necessary to provide a circuit which converts the syndromes thus simultaneously calculated such that they are input in the order of high-order coefficient data.

OBJECTS AND SUMMARY OF THE INVENTION

Accordingly, it is an object of the present invention to provide an improved Euclidean mutual division circuit in which the aforesaid shortcomings and disadvantages encountered with the prior art can be eliminated.

More specifically, it is an object of the present invention to provide an Euclidean mutual division circuit which can reduce its circuit scale significantly.

It is another object of the present invention to provide an Euclidean mutual division circuit which can be operated at high speed.

It is a further object of the present invention to provide an Euclidean mutual division circuit which can improve a throughput considerably.

According to an aspect of the present invention, there is provided a mutual division circuit which comprises first calculating units including a plurality of cascaded registers the number of which corresponds to that of corrections and which store therein coefficient data of respective polynomials $Ri(X)$, $Qi(x)$, $\lambda i(X)$ and $\mu i(X)$, the first calculating units storing therein divided results and a value output from the preceding stage and for effecting one of a normal connection calculation and a cross connection calculation in response to a switching instruction, second calculating units including a plurality of registers for storing therein the coefficient data of the polynomials $Ri(X)$, $Qi(X)$, $i(X)$ and $\mu i(X)$ and dividers for dividing outputs of the registers which store therein the coefficient data of the polynomials $Ri(X)$, $Qi(x)$, $\lambda i(x)$ and $\mu i(X)$, the second calculating units storing therein a value output from the final stage of the first calculating units and carrying out one of a normal connection division calculation and a cross connection division calculation in response to a switching instruction to thereby supply the calculated result to the first calculating units, and a switching judging units for generating the switching instruction for designating one of the normal connection and the cross connection on the basis of a predetermined initial value and a value stored in the second calculating units and supplying the same to the first and second calculating units.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

The present invention will now be described with reference to the drawings.

A method according to an embodiment of the present invention proposes an Euclidean mutual division method which is fully different in arrangement from those previously-proposed and which can realize the Euclidean mutual division algorithm by a more simplified circuit configuration.

According to the method of this embodiment, since data to be divided are constantly produced from the same place, the circuit for commonly using the divider for a finite field and the control circuit therefore are not needed unlike the arrangement of the prior art. Furthermore, since the circuit for determining the operation on the basis of the order of polynomial and the control circuit therefor are realized by the single circuit, the circuit scale can be reduced.

A method C according to this embodiment will be described with reference to FIG. 8 of the accompanying drawings.

Figure 8:
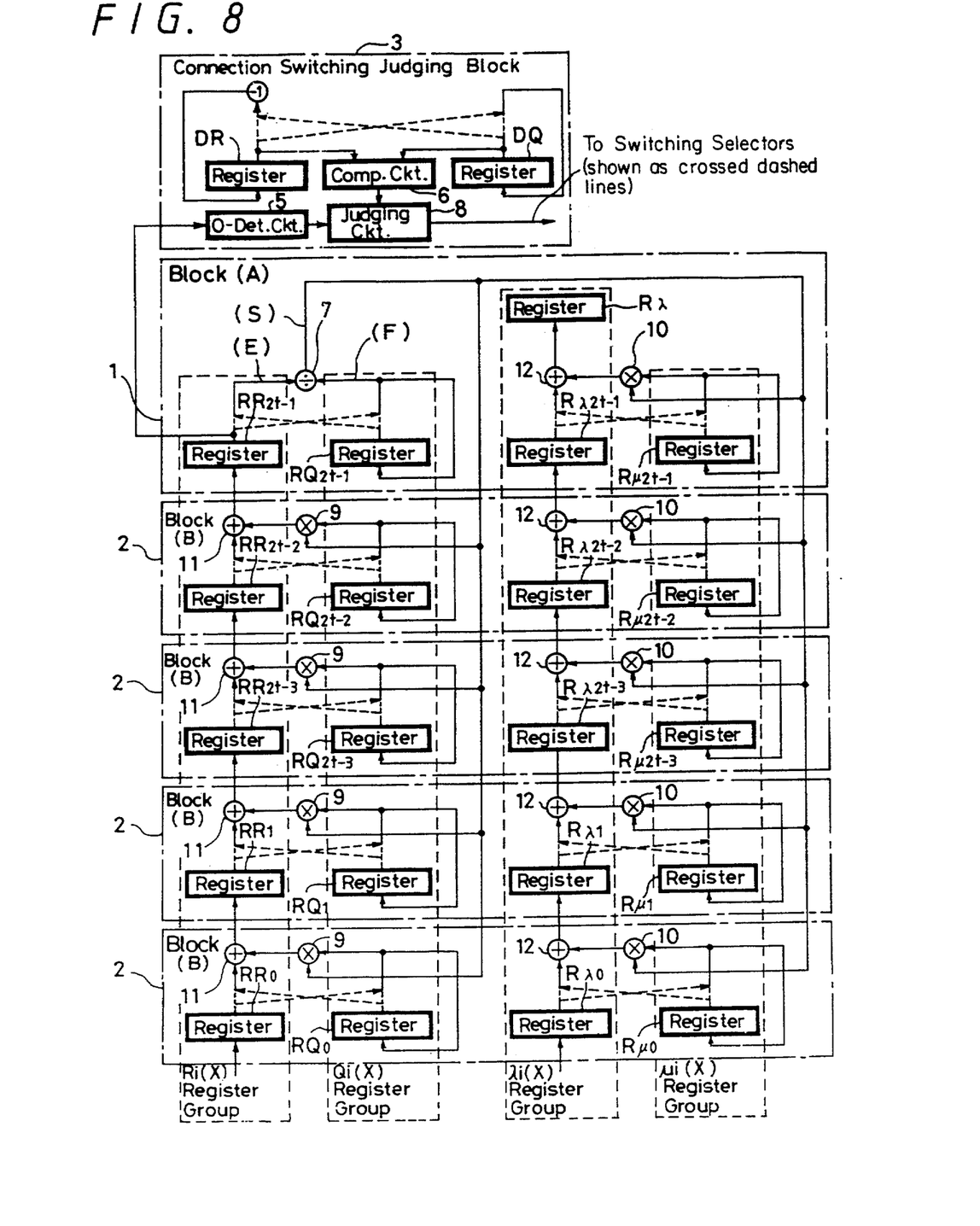
FIG. 8 is a block diagram showing an embodiment of an Euclidean mutual division circuit according to the present invention.

As shown in FIG. 8, this arrangement comprises one block (A) 1, a plurality of blocks (B) 2 and a connection switching judging block 3. The block (A) 1 may be formed of only one unit regardless of the error correction number t, while the other block (B) 2 must be formed of 2t−1 blocks in the case of the error correction system which corrects errors of t symbols.

Respective register groups provided in these blocks (A) 1 and (B) 2 are divided in the longitudinal direction and serve as register groups which sequentially hold coefficient data of $Ri(X)$, $Qi(X)$, $\lambda i(X)$ and $\mu i(X)$ from left. Higher coefficient data are held in these register groups in accordance with the orders indicated by $dRi$ and $dQi$.

As the initial values thereof, the coefficient data of $R0(X) = S(X)$ are sequentially substituted into registers $RR2t-1 \ldots RR0$. Likewise, higher coefficient data of $Q0(X) = X2t$ are sequentially substituted into registers $RQ2t-1 \ldots RQ0$. Thus, the most significant bit is 1 and the remainders are all 0, i.e., registers $R\lambda 2t \ldots R\lambda 0$ are held at 0 and the lowest order $R\mu 0$ is held at 1 and the remaining registers $R\mu 2t-1 \ldots R\mu 0$ are all held at 0.

0 is constantly input to the input terminal from the lower-order block of the last block of the block (B) 2.

A coefficient data stored in the register $RR2t-1$ of the coefficient data of Ri-order of $Ri(X)$ of the block (A) 1 is detected in zero by a 0-detection circuit 5 provided in the connection switching block 3.

The dRi and dQi are respectively stored in the registers DR, DQ of the connection switching block 3. Initial values are 2t−1 and 2t, respectively.

Outputs of the registers DR, DQ are input to any of the registers DR, DQ through a switching selector. At that time, −1 is added to the input value that is input to the register DR. The switching selector controls the normal connection and the cross connection in response to the switching instruction of a judging circuit 8 similarly to the switching selectors of blocks (A) 1 and (B) 2 which will be described later on.

A special circuit that sets the initial values is required in addition to the circuit arrangement of FIG. 8. This special circuit is not essential to the present invention and may be formed of a simple circuit. Therefore, this special circuit need not be described herein.

Operation of this embodiment will be described with reference to FIG. 8.

As shown in FIG. 8, values of the registers DR, DQ to which the initial values are set are compared with a comparator circuit 6. If DR<DQ and the status of the register $RR2t-1$ ($RR2t-1 \neq 0$) is supplied to the decision circuit 8 from the 0-detection circuit 5, then the switching selector shown by a dashed line is switched to the cross-relation side. In other cases, the switching selector is not connected to the cross-relation side. Upon switching, all switching selectors may be switched simultaneously.

In the block (A) 1, after the switching selector is switched, the coefficient data of dRi−1 order of Ri−1(X) and the coefficient data of Qi−1 order of Qi−1(x) are supplied through the switching selector to a divider 7 for a finite field. The divider 7 for a finite field divides inputs E and F of FIG. 8 and outputs a result S.

Using the result S of the divider 7 for a finite field, the calculation is carried out by multipliers 9, 10 and adders 11, 12 of the block (A) 1 and the respective blocks (B) 2. According to this procedure, in the polynomial R(X), the coefficient data from the coefficient data of dRi-order to the coefficient data of 0 order are stored in the registers $RR2t-1$ to RR0 in the order of higher coefficient data. Similarly, in the polynomials Qi(x), the coefficient data from the coefficient data of dQ2i-order to the coefficient data of 0-order are sequentially stored in the registers RQ2t to RQ0. Also in the respective polynomials $\lambda i(X)$ and $\mu i(X)$, similarly, the respective coefficient data are sequentially stored in the registers $R\lambda 2t-1$ to $R\lambda 0$ and from registers $R\mu 2t-1$ to $R\mu 0$ in the order of higher coefficient data.

By the above procedure, the calculation of the first step in the improved Euclidean mutual division method (2) is effected. Accordingly, if this procedure is repeated 2t times, then $\sigma(X)$ and $\omega(X)$ can be obtained similarly to the method B.

Examples of operation of the mutual division circuit of this invention will be described with reference to FIGS. 9 to 13.

Figure 9:
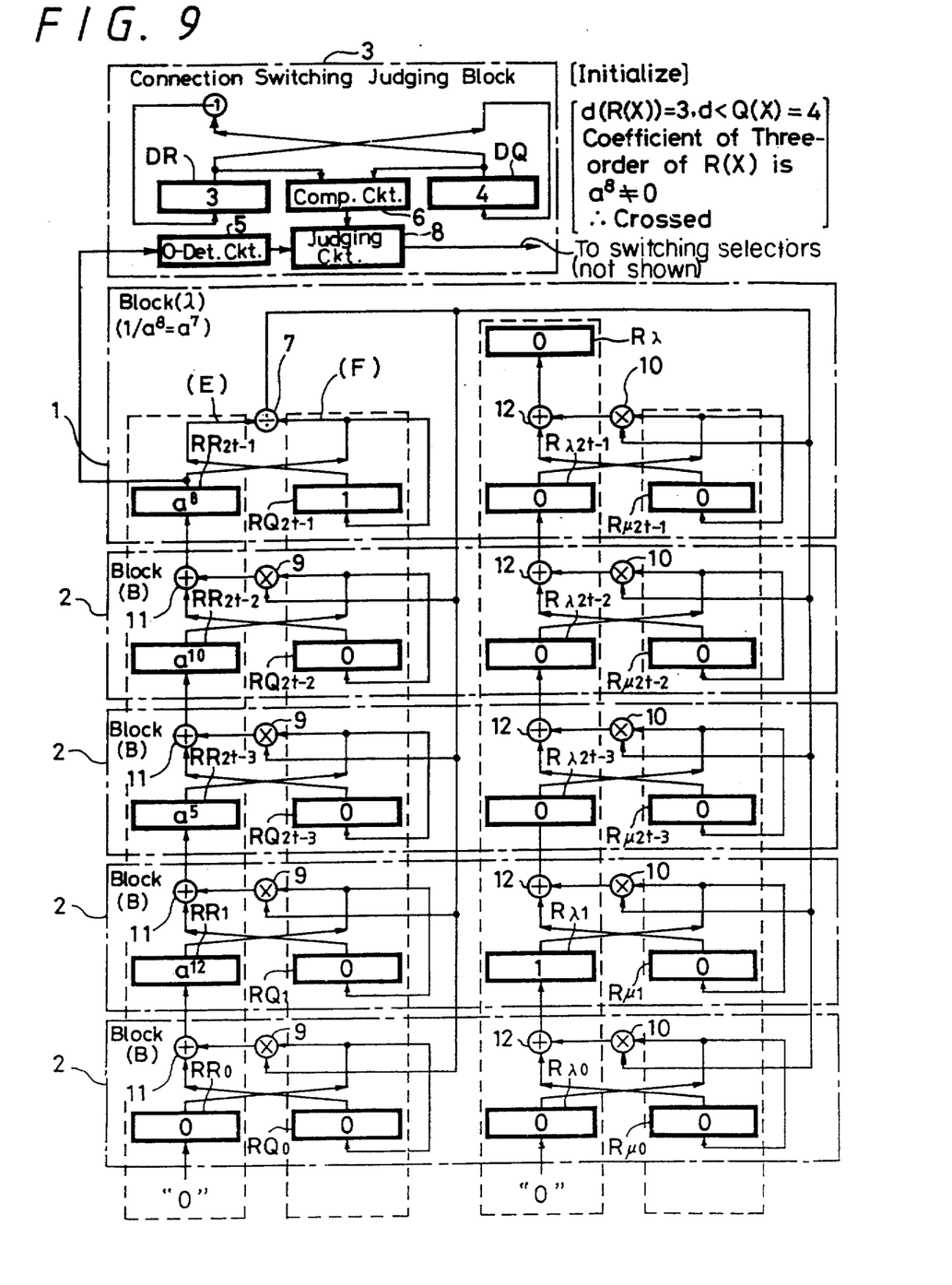
FIGS. 9 through 13 are respectively diagrams each showing an example in which the Euclidean mutual division circuit shown in FIG. 8 is operated.

Registers DR, DQ, $RR2t-1$ to RR0, RQ2t to RQ0, $R\mu 2t-1$ to $R\lambda 0$ and $R\mu 2t-1$ to $RR\mu 0$ are all already initialized. In FIG. 9, since the condition that the coefficient data of dR0-order of dR0=3, dQ0=4 and R(X) cross $\alpha$ 8 is satisfied, all switching selectors are switched to the cross-mode side. The divider 7 for a finite field effects a division of $1/\alpha$ 8 and a divided result, $\alpha$ 7 is input to the multipliers 9 and 10 of the block (A) 1 and respective blocks (B) 2.

Figure 10:
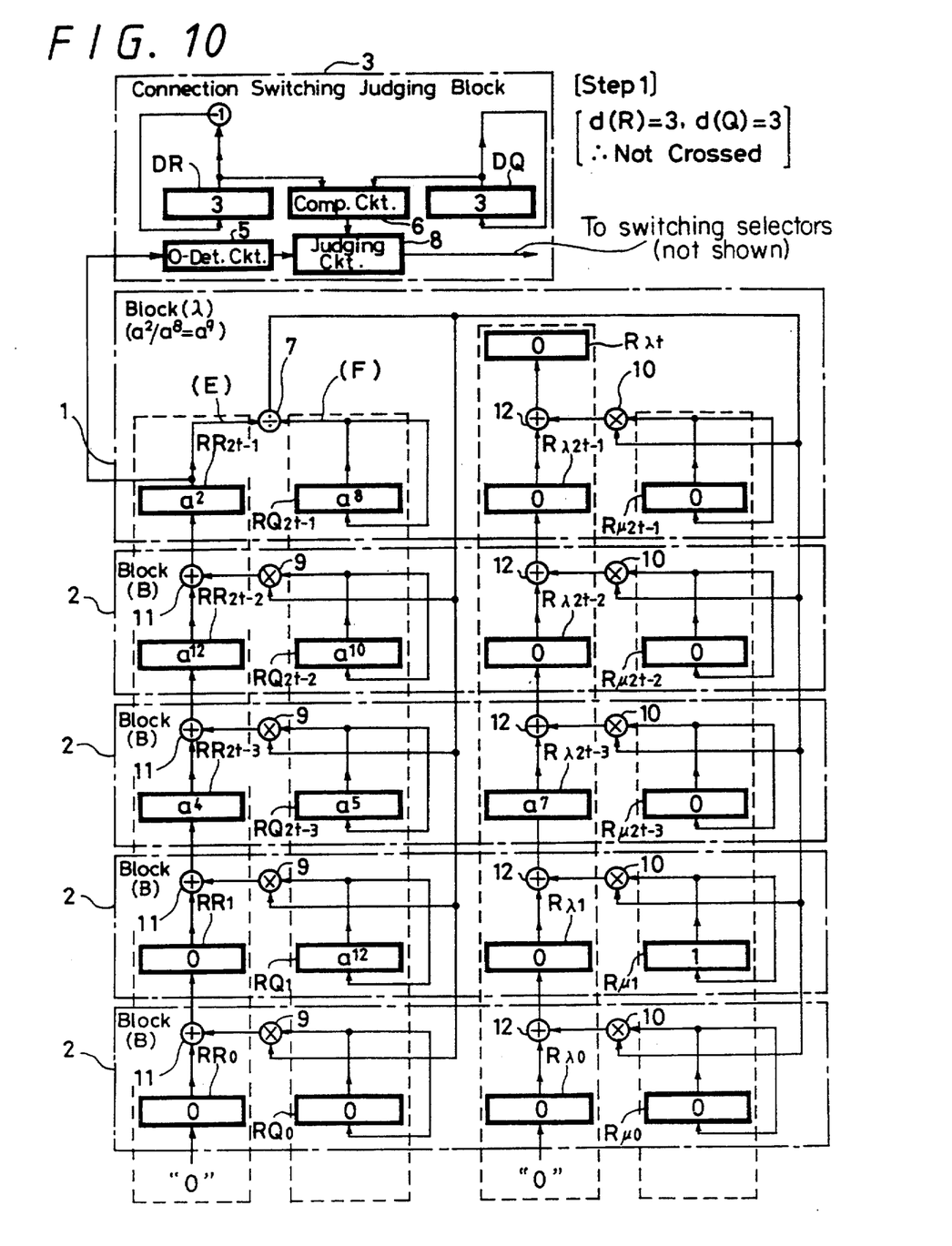

Calculated results of the respective calculation units are stored in the registers at the next step and obtained as shown in FIG. 10. These results are coincident with the results which are obtained by the method B as shown in FIG. 9.

In FIG. 10, since dR1=3 and dQ1=3, the cross connection condition is not satisfied so that all switching selectors are connected in the normal connection mode. Therefore, a calculation of $\alpha$ 2/$\alpha$ 8 is carried out by the finite field divider 7 and a divided result, i.e., $\alpha$ 9 is input to the multipliers 9, 10 of the block (A) 1 and the respective blocks (B) 2. Then, calculated results done by the respective calculation units are stored in the registers at the next step and obtained as shown in FIG. 11.

Figure 11:
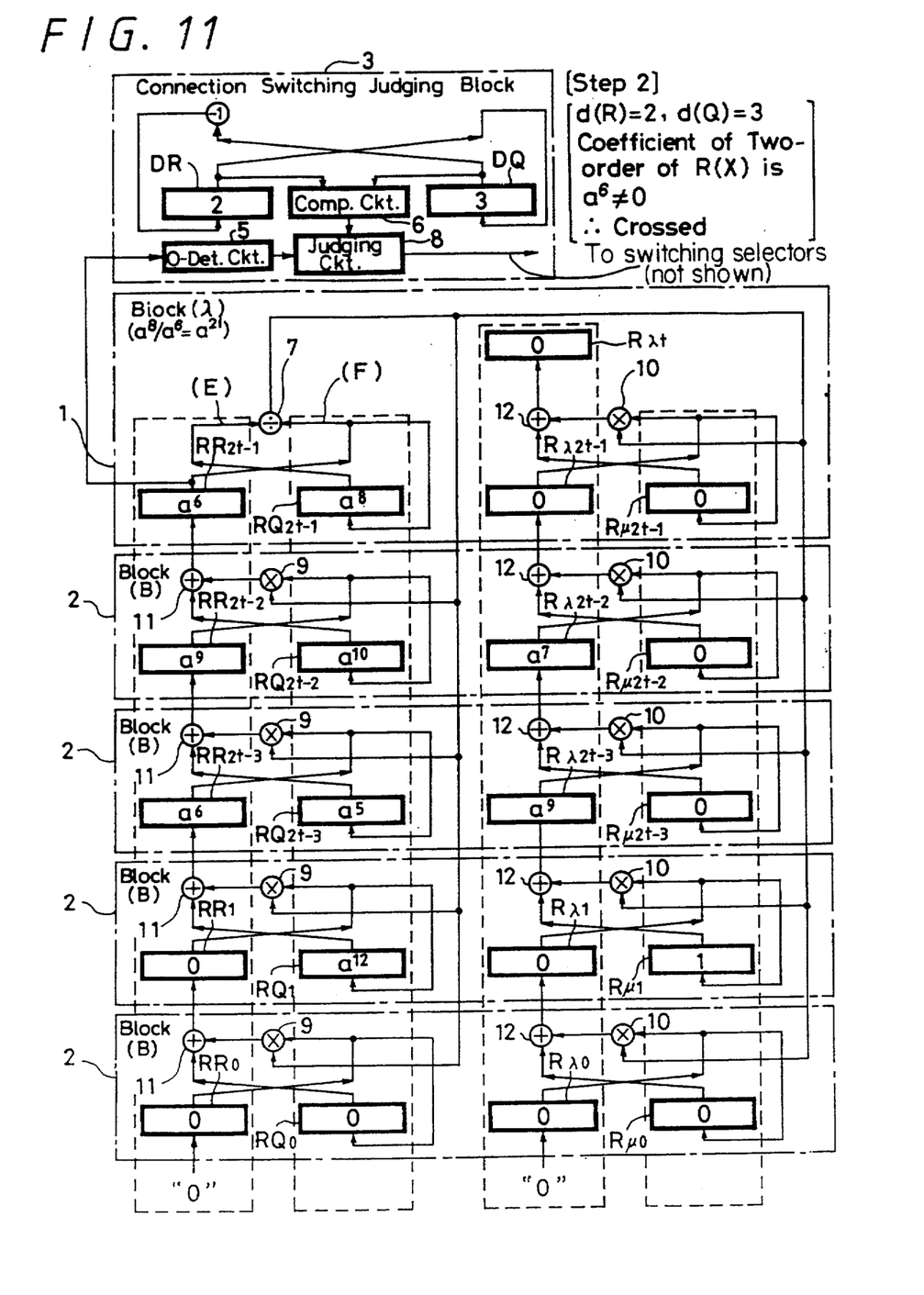

In FIG. 11, since dR2=2 and dQ2=3, the second-order coefficient data of R2(X) becomes $\alpha$ 6 so that the cross connection condition is satisfied. Therefore, all switching selectors are connected in the cross connection mode and a calculation of $\alpha$ 8/$\alpha$ 6 is performed by the finite field divider 7. Then, a divided result, i.e., $\alpha$ 2 is input to the multipliers 9, 10 of the block (A) 1 and the respective blocks (B) 2. The calculated results done by the respective calculation units are stored in the registers at the next step and obtained as shown in FIG. 12.

Figure 12:
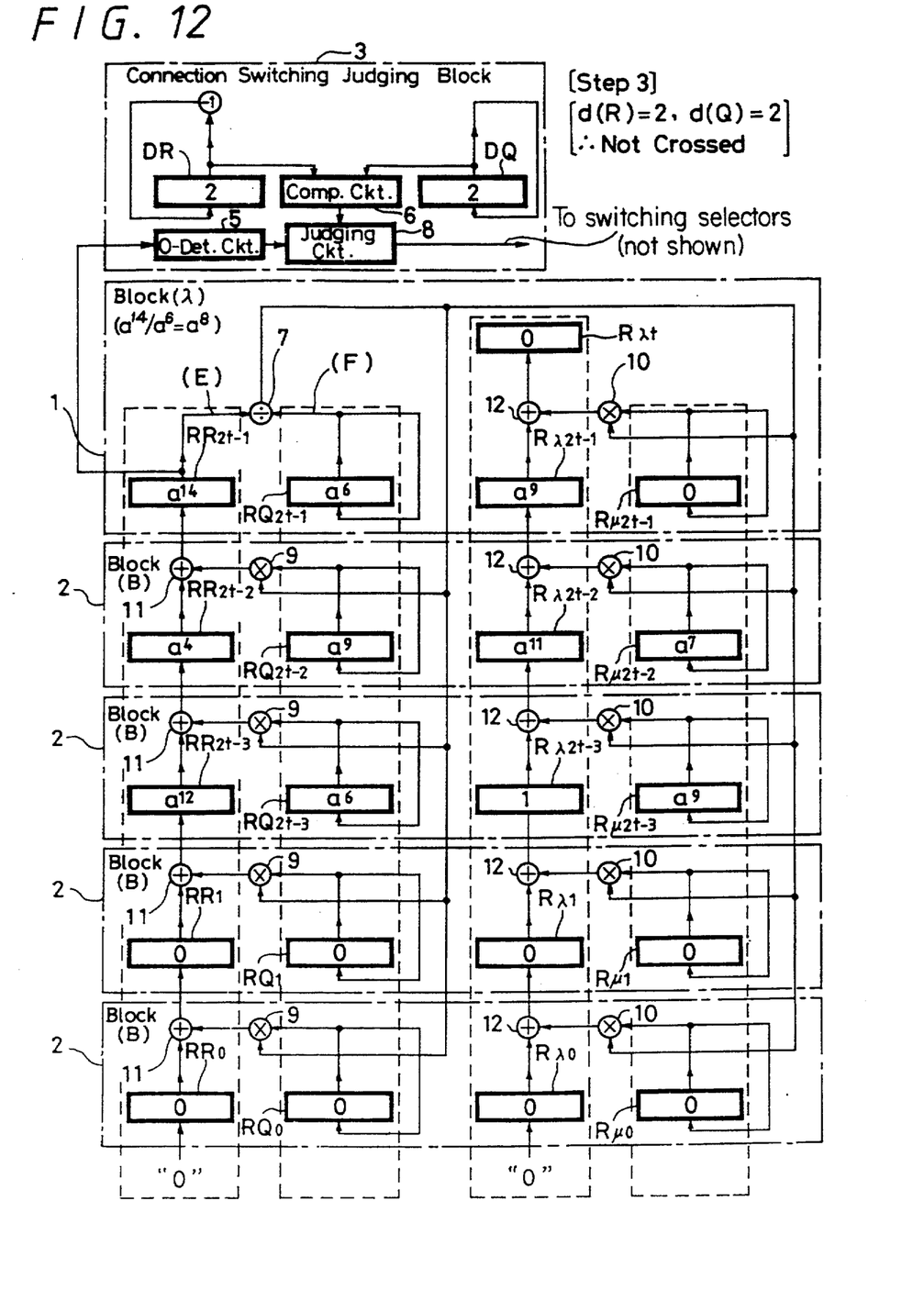

In FIG. 12, since dR3=2 and dQ3=2, the cross connection condition is not satisfied so that all switching selectors are connected in the normal connection mode. Thus, the calculation of $\alpha$ 14/$\alpha$ 6 is performed by the finite field divider 7 and a $\alpha$ 8 of a divided result is input to the multipliers 9, 10 of the block (A) 1 and the respective blocks (B) 2. The calculated results of the respective calculation units are stored in the registers at the next step and obtained as shown in FIG. 13.

Figure 13:
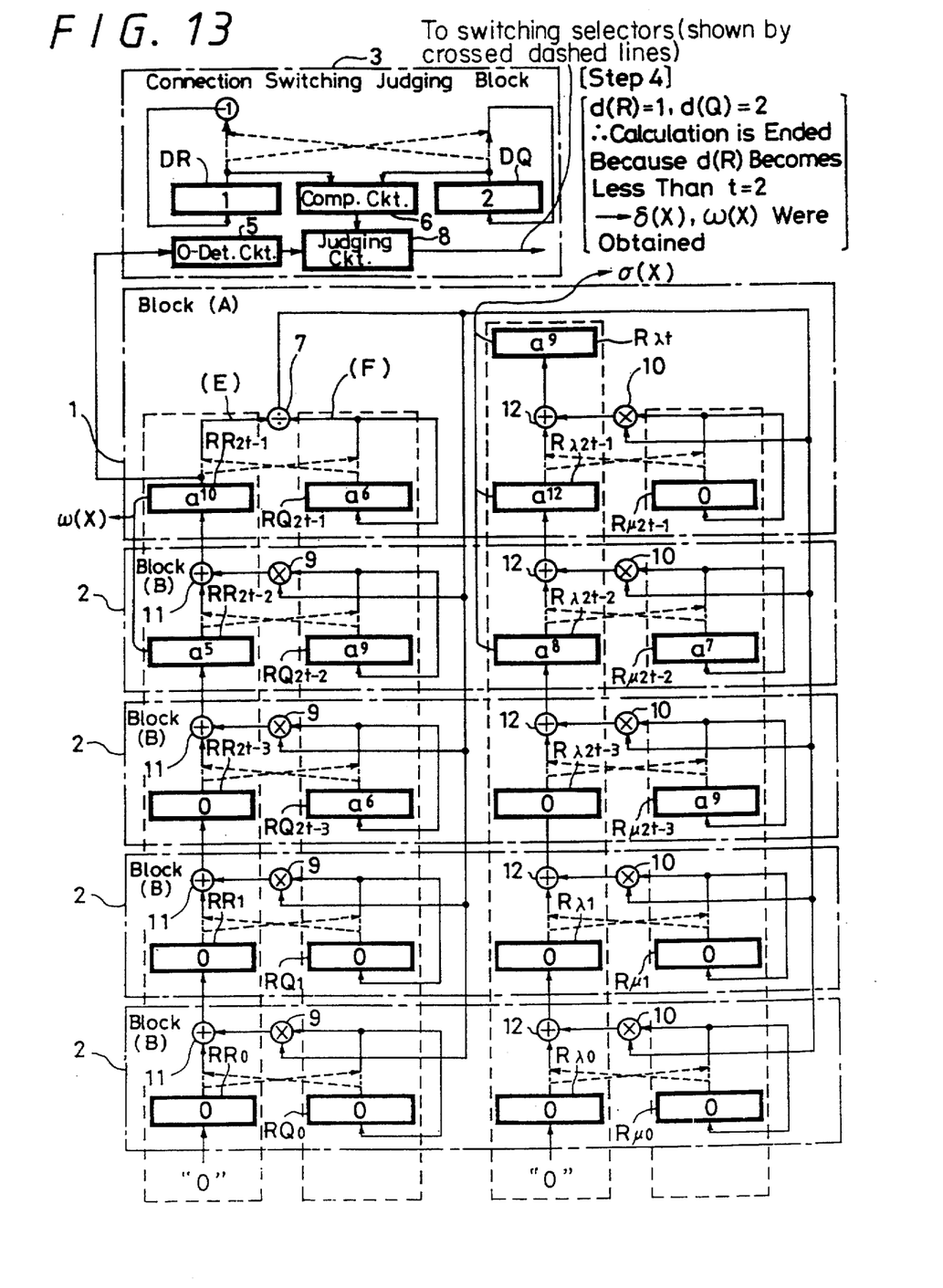

In FIG. 13, since dR4=1 and dQ4=2, dRi becomes less than t=2. Therefore, the calculation is finished and $\omega(X)$ and $\sigma(X)$ are calculated.

As shown in FIG. 9 and the following drawings, the calculation is carried out in the cross-mode at the first and third steps and in the normal mode at the second and fourth steps so that σ(X) and ω(X) are finally obtained in FIG. 13.

As described above, this embodiment is different from the method B as earlier noted in essential idea. More specifically, according to the method B, the coefficient data of respective polynomials are serially input to and calculated by the mutual division units 101 in the higher order. Whereas, according to the method of the present invention, all coefficient data are stored in the registers DR, DQ, RR2t−1 to RRO, RQ2t to RQO, RΛ2t−1 to RΛO and Rμ2t−1 to RRμO. As a result, in the calculation of one step of the improved Euclidean mutual division unit (2), according to the method B, all coefficient data of polynomials are serially calculated by one mutual division unit 101. Whereas, according to the method of the present invention, each coefficient data is calculated by all calculation units (block (A) 1 and respective blocks (B) 2). Therefore, although the calculation amount itself is not changed, the constructing method can be simplified significantly.

Further, according to the method of the present invention, as earlier described with reference to FIG. 8, the coefficient data of dRi-order of Ri(X) and the coefficient data of the dQi-order of Qi(X) which are input to the divider 7 for a finite field are stored in the registers RR2t−1 and RQ2t−1 of the block (A) 1. Therefore, the coefficient data are constantly input to the divider 7 for a finite field immediately after the switching selectors for Ri(X) and Qi(X) of the block (A) 1. As set out above, according to the method of the present invention, since data are constantly input to the divider 7 for a finite field from the same place, the additional circuit that is used to commonly utilize the divider 7 for a finite field becomes unnecessary, thereby making it possible to reduce the scale of the overall arrangement.

While each mutual division unit 101 must independently include the circuit which determines the size of dRi and dQi and which also detects 0 of the coefficient data of the dRi-order of Ri(X) according to the method B, according to the method of the present invention, the above processing is carried out only by the connecting switching decision block 3, thereby making it possible to reduce the scale of the circuit.

Further, while each mutual division unit 101 requires 2 multipliers, e.g., 4t multipliers in total if the number of correctable symbols is t according to the method B, the method of the present invention can reduce the number of multipliers to 4t−1.

Furthermore, while upon initialization the input signal RO(x), i.e., coefficient data S1, S2, ..., S2t of the syndrome polynomials must be input in the sequential order of the higher coefficient data according to the method B, according to the method of the present invention, the coefficient data of 2t syndrome polynomials can be simultaneously input to thereby effect the initialization.

Since the syndromes are obtained as the result of the matrix calculation, it is essential that the syndromes can be obtained simultaneously. Therefore, while the syndromes, which are simultaneously obtained, are converted into serial data and then input according to the method B, according to the method of the present invention, the coefficient data of the syndromes thus obtained simultaneously can be directly input as they are, thereby removing the circuit which converts the syndromes into the serial data. At the same time, if the syndromes are converted into serial data, the it is possible to prevent a time (throughput) for the result from being increased.

Further, according to the method of the present invention, various methods are known to initialize the respective registers DR, DQ, RR2t−1 to RRO, RQ2t−1 to RQO, RΛ2t−1 to RΛO and Rμ2t−1 to RRμO.

If selectors are connected to the inputs of the respective registers DR, DQ, RR2t−1 to RRO, RQ2t−1 to RQO, RΛ2t−1 to RΛO and Rμ2t−1 to RRμO, then all registers can be initialized simultaneously. On the other hand, if initial values of the respective polynomials are serially input to the registers of the lowest-order of the polynomials, then the above respective registers can be initialized sequentially.

As set forth above, according to the present invention, the scale of circuit can be reduced considerably. Also, the high speed operation becomes possible to increase the throughput considerably.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A mutual division circuit comprising:
first calculating means including a plurality of cascaded registers the number of which corresponds to that of corrections and which store therein coefficient data of respective polynomials Ri(X), Qi(X), λi(X) and μi(X), said first calculating means storing therein divided results and a value output from a preceding stage and for effecting one of a normal connection calculation and a cross connection calculation in response to a switching instruction;
second calculating means forming said preceding stage including a plurality of registers for storing therein the coefficient data of said polynomials Ri(X), Qi(X), λi(X) and μi(X) and dividers for dividing outputs of said registers which store therein the coefficient data of said polynomials Ri(X), Qi(X), λi(X) and μi(X), said second calculating means storing therein a value output from the final stage of said first calculating means and carrying out one of a normal connection division calculation and a cross connection division calculation in response to a switching instruction to thereby supply the calculated result to said first calculating means; and
switching judging means for generating said switching instruction for designating one of the normal connection and the cross connection on the basis of a predetermined initial value and a value stored in said second calculating means and supplying the switching instruction to said first and second calculating means.

2. The mutual division circuit according to claim 1, wherein said 2t−1 first calculating means are cascaded if said correction number is t.

3. The mutual division circuit according to claim 1, wherein said first calculating means comprises multipliers for multiplying outputs of said registers which store therein coefficient data of said polynomial Ri(X) (or Qi(X)) and divided results of said dividers, adders for adding the outputs of said registers which store therein coefficient data of said polynomial $Q_i(X)$ (or $R_i(X)$) and outputs of said multipliers, multipliers for multiplying outputs of said registers which store therein coefficient data of said polynomial $\lambda_i(X)$ (or $\mu_i(X)$) and divided outputs of said dividers and adders for adding outputs of said registers which store therein coefficient data of said polynomial $\mu_i(X)$ (or $\lambda_i(X)$) and outputs of said multipliers.

4. The mutual division circuit according to claim 1, wherein said second calculating means comprises multipliers for multiplying outputs of said registers which store therein coefficient data of said polynomial $\lambda_i(X)$ (or $\mu_i(X)$) and divided outputs of said dividers and adders for adding outputs of said registers which store therein coefficient data of said polynomial $\mu_i(X)$ (or $\lambda_i(X)$) and outputs of said multipliers.

5. The mutual division circuit according to claim 1, wherein said switching judging means comprises two registers for respectively storing order data dRi and dQi, comparing means for comparing outputs of said two registers, detecting means for detecting whether or not the output of said register which stores therein coefficient data of said polynomial $R_i(X)$ of said second calculating means is 0; and judging means for generating said switching instruction for designating the cross-connection to said first and second calculating means if $dR1<DQi$ and coefficient data of said polynomial $R_i(X)$ is not zero on the basis of a compared result of said comparing means and a detected result of said detecting means.

* * * * *